United States Patent
Tseng

(10) Patent No.: US 7,951,628 B2
(45) Date of Patent: May 31, 2011

(54) PIXEL STRUCTURE, DISPLAY PANEL, PHOTOELECTRIC DEVICE AND MANUFACTURING METHOD THEREOF

(75) Inventor: Chin-An Tseng, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 406 days.

(21) Appl. No.: 12/270,871

(22) Filed: Nov. 14, 2008

(65) Prior Publication Data

US 2010/0072476 A1    Mar. 25, 2010

(30) Foreign Application Priority Data

Sep. 22, 2008 (TW) .............................. 97136345 A

(51) Int. Cl.
*H01L 21/00* (2006.01)
*H01L 27/15* (2006.01)
(52) U.S. Cl. ................. 438/30; 257/83; 257/84
(58) Field of Classification Search .................... 257/59, 257/72, 83–84, E27.112, 125; 438/22–30
See application file for complete search history.

(56) References Cited

U.S. PATENT DOCUMENTS

| 5,923,390 | A  | * | 7/1999 | Jung Mok et al. | ............ 349/38 |
| 6,940,579 | B2 | * | 9/2005 | Ozaki et al. | ................... 349/192 |
| 7,675,582 | B2 | * | 3/2010 | Luo et al. | ........................ 349/39 |
| 2005/0117078 | A1 | | 6/2005 | Lai et al. | |
| 2006/0119753 | A1 | | 6/2006 | Luo et al. | |

* cited by examiner

*Primary Examiner* — Calvin Lee
(74) *Attorney, Agent, or Firm* — Jianq Chyun IP Office

(57) ABSTRACT

A pixel structure includes a substrate, a first and a second patterned conductive layers, and a pixel electrode. The first patterned conductive layer, disposed on the substrate, includes at least one scan line, at least one gate, and at least one common electrode line. The second patterned conductive layer, disposed on the first patterned conductive layer, includes at least one data line, at least one source/drain, and at least one first patterned layer partly disposed on the common electrode line. The pixel electrode, disposed on the second patterned conductive layer, includes at least one first part and one second part. The first part partly covers the first patterned layer and the common electrode line. The second part, connected to the source/drain, covers the other part of the first patterned layer. The first and second patterned layers compose at least one first capacitance.

8 Claims, 6 Drawing Sheets

PIXEL STRUCTURE, DISPLAY PANEL, PHOTOELECTRIC DEVICE AND MANUFACTURING METHOD THEREOF

CROSS-REFERENCE TO RELATED APPLICATION

This application claims the priority benefit of Taiwan application serial no. 97136345, filed on Sep. 22, 2008. The entirety of the above-mentioned patent application is hereby incorporated by reference herein and made a part of specification.

BACKGROUND OF THE INVENTION

1. Field of the Invention

The present invention relates to a pixel structure and a manufacturing method thereof, and particularly to a pixel structure capable of increasing storage capacitor, a display panel and a photoelectric device having the pixel structure and a manufacturing method thereof.

2. Description of Related Art

The rapid development of multimedia society mostly benefits from the tremendous progress in semiconductor devices or display devices. As for displays, the thin film transistor liquid crystal display (TFT-LCD) equipped with such superior advantages as high resolution, high space-effectiveness, low power consumption and no radiation has become the mainstream of the market.

The TFT-LCD mainly consists of a thin film transistor (TFT) array, a color filter and a liquid crystal layer. The TFT array is composed of a plurality of TFTs arranged in array and pixel electrodes disposed as corresponding to each of the TFTs respectively. The TFTs are used as switching devices of a liquid crystal display. Moreover, to control each individual pixel unit, a certain pixel is usually selected through a scan line and a data line, and a display data corresponding to the certain pixel is displayed by providing an appropriate operating voltage. In addition, a storage capacitor in a conventional pixel structure 100 is structured as shown by FIG. 1. The storage capacitor includes a first patterned conductive layer 110 connected to a common voltage and a second patterned conductive layer 120 electrically connected to a pixel electrode 130 through a contact window 122, wherein each one of the first patterned conductive layer 110, the second patterned conductive layer 120, and the pixel electrode 130 is a continuous structure and is without other portion (such as division portion, branch portion, etc.). The two conductive layers 110 and 120 compose the storage capacitor.

Within the conventional storage capacitor, if one intends to increase a capacitance of the storage capacitor, the most direct means is to increase areas of the first patterned conductive layer 110 and the second patterned conductive layer 120. However, increasing the areas of the conductive layers 110 and 120 would reduce an aperture ratio of the pixel structure.

SUMMARY OF THE INVENTION

The present invention provides a pixel structure, which increases a storage capacitor per unit area of a storage capacitor with a design of the pixel structure. As a result, an area occupied by the storage capacitor is reduced, and an aperture ratio of the pixel structure is increased.

The present invention further provides a method of manufacturing a pixel structure. The method manufactures said pixel structure.

The present invention further provides a display panel having the pixel structure.

The present invention still further provides a method of manufacturing a display panel. The method manufactures said display panel.

The present invention further provides a photoelectric device having the display panel to enhance an efficiency per unit area of the storage capacitor and thereby increasing an aperture ratio.

The present invention still further provides a method of manufacturing the photoelectric device.

The present invention provides a pixel structure including a substrate, a first patterned conductive layer, a second patterned conductive layer and a pixel electrode. The first patterned conductive layer is disposed on the substrate and includes at least one scan line, at least one gate connected to the scan line, and at least one common electrode line. The scan line is electrically isolated from the common electrode line. The second patterned conductive layer is disposed on the first patterned conductive layer, and the second patterned conductive layer includes at least one data line intersected with the scan line, at least one source/drain connected to the data line, and at least one first patterned layer partly disposed on the common electrode line. The first patterned layer is electrically isolated from the data line, and the gate, the source and the drain compose at least one thin film transistor (TFT). The pixel electrode is disposed on the second patterned conductive layer and includes at least one first part and at least one second part electrically isolated from the first part. The first part covers a part of the first patterned layer and a part of the common electrode line. The first part is connected to the first patterned layer through at least one first contact window and connected to the common electrode line through at least one second contact window. The second part covers the other part of the first patterned layer, and the second part is connected to the source/drain. The first patterned layer and the second part compose at least one first capacitance.

According to an embodiment of the present invention, the first patterned conductive layer further includes at least one second patterned layer. A second patterned layer is disposed on the substrate and partly under the first patterned layer. The second patterned layer is electrically connected to the second part of the pixel electrode through at least one third contact window and is electrically isolated from the common electrode line and the scan line. The first patterned layer and the second patterned layer compose at least one second capacitance.

The present invention further provides a display panel including said pixel structure.

The present invention still further provides a photoelectric device including said display panel.

The present invention further provides a method of manufacturing a pixel structure. The method includes following steps. First, a substrate is provided. Afterwards, a first patterned conductive layer is formed on the substrate, and the first patterned conductive layer includes at least one scan line, at least one gate connected to the scan line, and at least one common electrode line. The scan line is electrically isolated from the common electrode line. Thereafter, a second patterned conductive layer is formed on the first patterned conductive layer, and the second patterned conductive layer includes at least one data line intersected with the scan line, at least one source/drain connected to the data line, and at least one first patterned layer partly disposed on the common electrode line. The first patterned layer is electrically isolated from the data line, and the gate, the source and the drain compose at least one TFT. Finally, a pixel electrode is formed on the second patterned conductive layer and includes at least one first part and at least one second part electrically isolated from the first part. The first part covers a part of the first patterned layer and a part of the common electrode line, and the first part is connected to the first patterned layer through at least one first contact window, and connected to the common electrode line through at least one second contact window. The second part covers the other part of the first patterned layer and is connected to the source/drain. The first patterned layer and the second part compose at least one first capacitance.

According to an embodiment of the present invention, when the first patterned conductive layer is formed on the substrate, at least one second patterned layer is further formed on the substrate. The second patterned layer is partly disposed under the first patterned layer and electrically connected to the second part of the pixel electrode through at least one third contact window, and the second patterned layer is electrically isolated from the common electrode line and the scan line. The first patterned layer and the second patterned layer compose at least one second capacitance.

The present invention further provides a method of manufacturing a display panel, and the method includes a method of manufacturing said pixel structure.

The present invention further provides a method of manufacturing a photoelectric device, and the method includes said method of manufacturing the display panel.

In summary, the common electrode line of the storage capacitor in the pixel structure in the present invention is electrically connected to the at least one first patterned layer of the second patterned conductive layer through the at least one second contact window, the at least one first part of the pixel electrode and the at least one first contact window. Consequently, the first patterned layer of the second patterned conductive layer and the second part of the pixel electrode generate at least one first capacitance. According to another embodiment of the present invention, the at least one second patterned layer of the first patterned conductive layer and the at least one first patterned layer of the second patterned conductive layer further compose at least one second capacitance. Thus, under the precondition that an equivalent storage capacitor value can be achieved, an area occupied by the storage capacitor is reduced and thereby increasing an aperture ratio of the pixel structure.

In order to make the aforementioned and other objects, features and advantages of the present invention more comprehensible, several embodiments accompanied with figures are described in detail below.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention.

DESCRIPTION OF EMBODIMENTS

The First Embodiment

Figure 1:
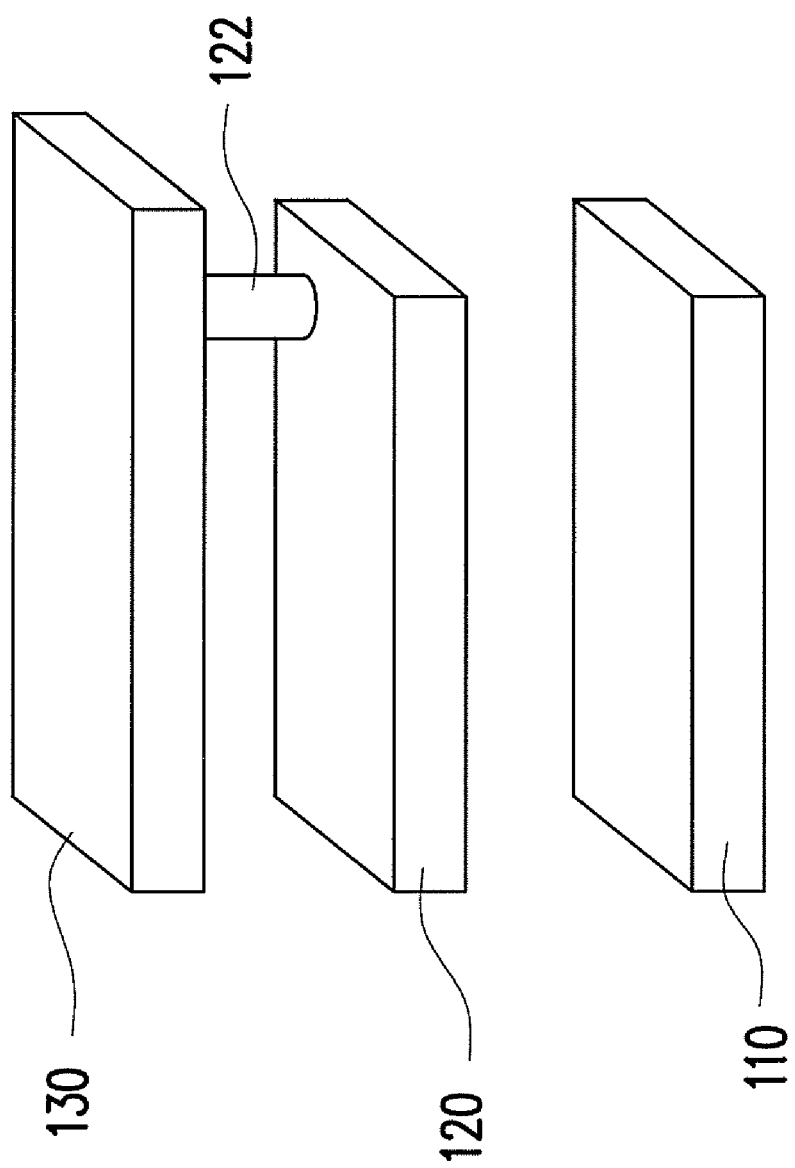
FIG. 1 is a structure diagram of a storage capacitor in a conventional pixel structure.
Figure 2A:
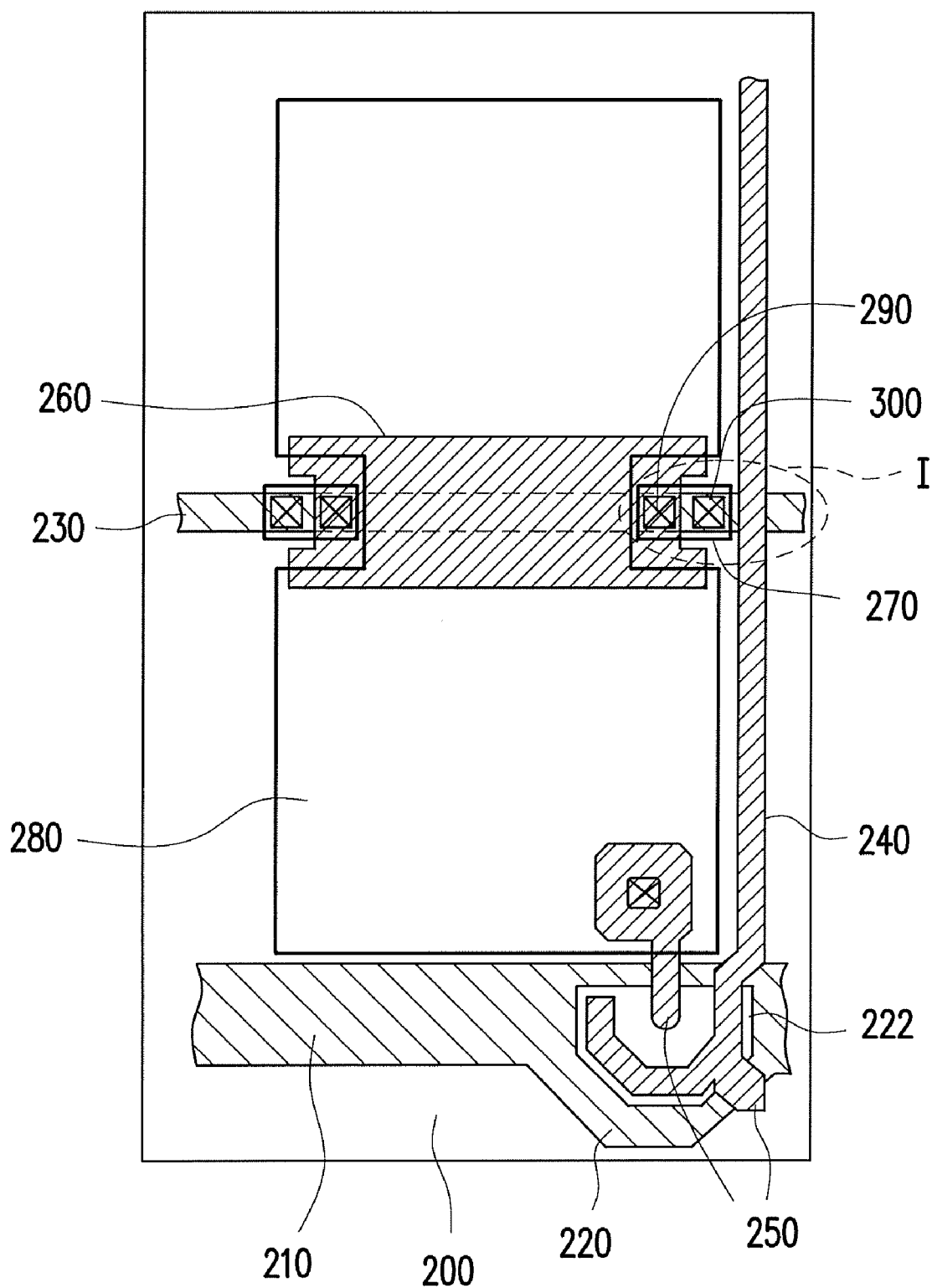
FIG. 2A is a top view of a pixel structure according to an embodiment of the present invention.
Figure 2B:
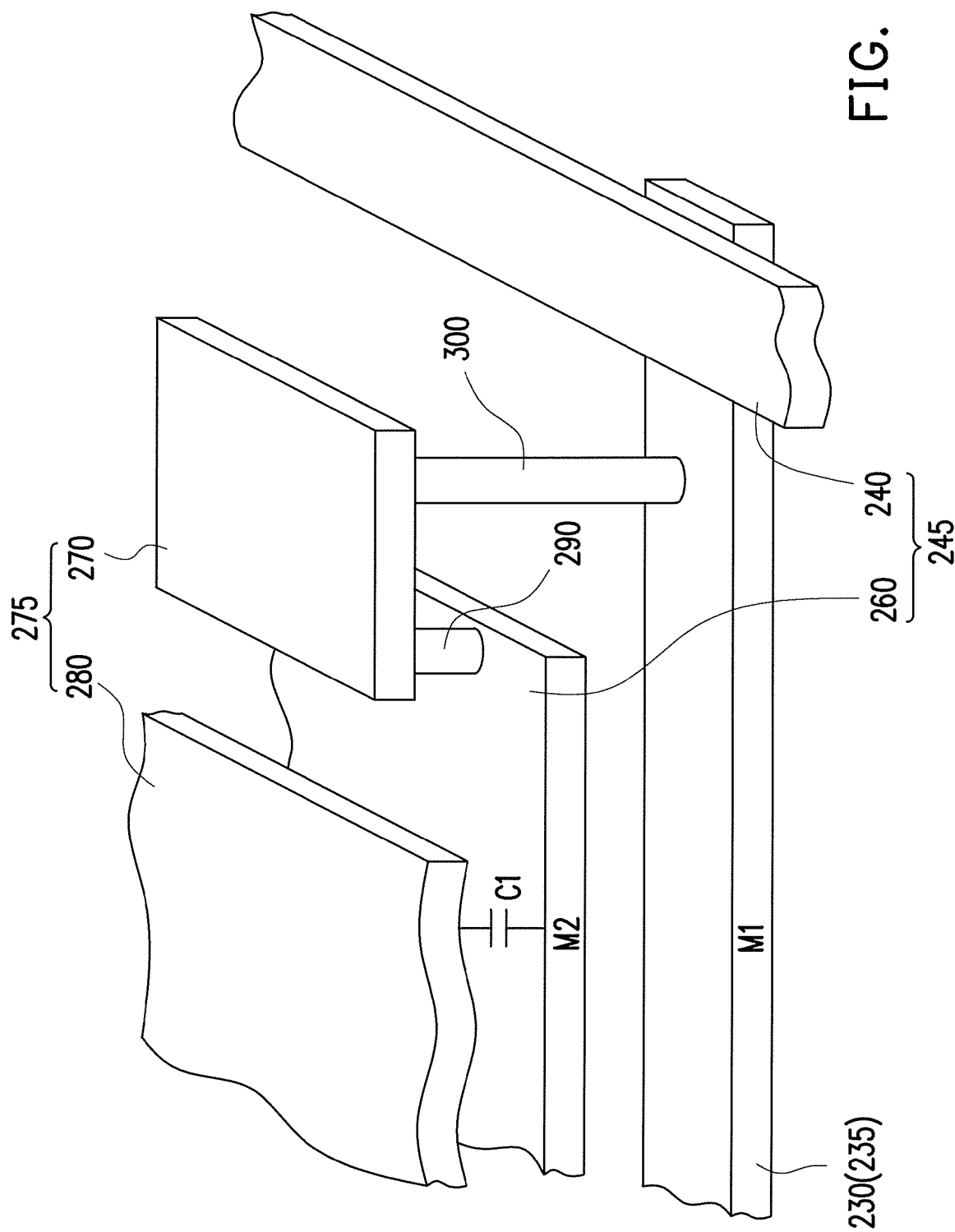
FIG. 2B is a schematic three-dimensional structure diagram of an area (corresponding to an area I in FIG. 2A) where the storage capacitor is located in the pixel structure of FIG. 2A.

FIG. 2A is a top view of a pixel structure according to an embodiment of the present invention. FIG. 2B is a schematic three-dimensional structure diagram of an area (corresponding to an area I in FIG. 2A) where the storage capacitor is located in the pixel structure of FIG. 2A. Referring to both FIGS. 2A and 2B, the pixel structure includes a first patterned conductive layer 235 and a second patterned conductive layer 245 and a pixel electrode 275 on a substrate 200.

According to the present embodiment, a material of the substrate 200 includes an inorganic transparent material (e.g., glass, quartz, other suitable materials, or a combination thereof), an organic transparent material (e.g., polyolefne, polythiourea, polyalcohols, polyester, rubber, a thermoplastic polymer, a thermosetting polymer, polyarylene, polymethylmethacrylate, polycarbonate, other suitable materials, a derivatives thereof, or a combination of the foregoing), an inorganic opaque material (e.g., silicon, ceramics, other suitable materials, or a combination thereof), or a combination of the foregoing.

The first patterned conductive layer 235 includes a scan line 210, a gate 220 and a common electrode line 230. The scan line 210 is connected to the gate 220. According to the present embodiment, the scan line 210 is electrically isolated from and disposed parallel to the common electrode line 230. However, such arrangement is only exemplary and is not intended to limit the present invention. According to other embodiments, the common electrode line 230 further includes a part perpendicular to the scan line 210 so that a top view of the common electrode line 230 substantially appears in a/an U, S, O, Z, W, V, 8, B, C, D, F, H, L, or P shape or other suitable shapes. Said design not only increases the capacity but also reduces light leakage. Preferably, the top view of the common electrode line 230 substantially appears in a/an U, S, O, 8, B, C, D, F, H, L or P shape. According to the present embodiment, the first patterned conductive layer 235 may be a single-layered or multilayer structure. A material of the first patterned conductive layer 235 may be a metal, e.g., gold (Au), silver (Ag), copper (Cu), tin (Tn), lead (Pb), hafnium (Hf), tungsten (W), molybdenum (Mo), neodymium (Nd), titanium (Ti), tantalum (Ta), aluminum (Al) or zinc (Zn), an alloy thereof, an oxide thereof, a nitride thereof, or a combination of the foregoing. Additionally, the present embodiment is exemplified by a scan line 210, a common electrode line 230 and a gate 220 for illustration, but the present invention is not limited thereto. In other embodiments, at least one of the scan line 210, the common electrode line 230 and the gate 220 may be designed as at least one to fulfill requirements of the designer.

The second patterned conductive layer 245 is disposed on the first patterned conductive layer 235 and includes a data line 240, a source/drain 250, and a first patterned layer 260. The data line 240 and the scan line 210 are intersected; the data line 240 is connected to the source/drain 250; and the first patterned layer 260 is electrically isolated from the data line 240. The second patterned conductive layer 245 may be a single-layered or a multilayer structure. A material of the second patterned conductive layer 245 may be a metal, e.g., Au, Ag, Cu, Tn, Pb, Hf, W, Mo, Nd, Ti, Ta, Al, or Zn, an alloy thereof, an oxide thereof, a nitride thereof, or a combination of the foregoing. Moreover, the present embodiment is exemplified by a data line 240, a source/drain 250 and a first patterned layer 260, but the present invention is not limited thereto. In other embodiments, at least one of the data line 240, the source/drain 250 and the first patterned layer 260 may be designed as at least one to fulfill requirements of the designer. In addition, two first patterned layers 260 are disposed near the left and right ends of the common electrode 230 as shown by FIG. 2A, but not limited thereto. One or a plurality of first patterned layers 260 may also be disposed near either the right or left end of the common electrode 230 or on other positions. Alternatively, on each of the plurality of positions in FIG. 2A, one or a plurality of first patterned layers 260 is disposed.

Moreover, an insulating layer (not shown) is further disposed between the first patterned conductive layer 235 and the second patterned conductive layer 245. The insulating layer may be a single-layered or a multilayer structure. A material of the insulating layer is, for example, an inorganic material (e.g., silicon oxide, silicon nitride, silicon oxynitride, silicon carbide, hafnium oxide, aluminum oxide, other materials, or a combination thereof), an organic material (e.g., photoresist, enzocyclobutane (BCB), cycloolefin, polyimide, polyamide, polyester, polyalcohols, polyethylene, polyphenylene, resin, polyether, polyketone, other suitable materials, or a combination thereof), or a combination of the foregoing.

Furthermore, an active layer 222 is further disposed between the gate 220 and the source/drain 250. A material of the active layer 222 may be amorphous silicon (a-Si), monocrystalline silicon, micro-silicon, polysilicon, an N-type doped silicide with said lattices, a P-type doped silicide with said lattices, a germanium silicide with said lattices, other materials, or a combination of the foregoing. A structure of the active layer 222 may be a single-layered or a multilayer structure. For example, the active layer 222 may have a single-layered structure consisting of a-Si and/or heavily doped N-type a-Si or have a double-layered structure consisting of a-Si and heavily doped N-type a-Si. Said structures may be arranged horizontally and/or vertically. The gate 220, the source/drain 250, and the active layer 222 constitute a thin film transistor (TFT). The present embodiment is exemplified by a bottom gate structure but not limited thereto; a top gate structure may also be used.

Still referring to FIGS. 2A and 2B, a pixel electrode 275 is disposed on the second patterned conductive layer 245, and the pixel electrode 275 includes a first part 270 and a second part 280. The first part 270 is electrically isolated from the second part 280. The first part 270 covers a part of the first patterned layer 260 and a part of the common electrode line 230. Further, the first part 270 is connected to the first patterned layer 260 through a first contact window 290 and connected to the common electrode line 230 through a second contact window 300. The second part 280 covers the other part of the first patterned layer 260 and is connected to the source/drain 250. In other words, the first part 270 of the pixel electrode 275 is mainly used for connecting the common electrode line 230 with the first patterned layer 260 so that a common voltage of the common electrode line 230 is transmitted to the first patterned layer 260, while the second part 280 of the pixel electrode 275 is used as a primary pixel electrode for the pixel structure. In addition, according to the present embodiment, the pixel electrode 275 may be a single-layered or a multilayer structure. A material of the pixel electrode 275 includes a transparent conductive material (e.g., indium tin oxide, indium zinc oxide, indium tin zinc oxide, hafnium oxide, zinc oxide, aluminum oxide, aluminum tin oxide, aluminum zinc oxide, cadmium tin oxide, cadmium zinc oxide, or a combination thereof), an opaque material (e.g., Au, Ag, Cu, Tn, Al, Pb, Mo, Ti, Ta, chromium, W, vanadium, Zn, an alloy thereof, a nitride thereof, other suitable materials, or a combination of the foregoing).

Additionally, a passivation layer (not shown) is further disposed between the pixel electrode 275 and the second patterned conductive layer 245. The passivation layer may be a single-layered or a multilayer structure. A material of the passivation layer is, for example, an inorganic material (e.g., silicon oxide, silicon nitride, silicon oxynitride, silicon carbide, hafnium oxide, aluminum oxide, other materials, or a combination thereof), an organic material (e.g., photoresist, enzocyclobutane (BCB), cycloolefin, polyimide, polyamide, polyester, polyalcohols, polyethylene, polyphenylene, resin, polyether, polyketone, other suitable materials, or a combination thereof), or a combination of the foregoing.

In particular, referring to both FIGS. 2A and 2B, the first patterned layer 260 of the second patterned conductive layer 245 and the second part 280 of the pixel electrode 275 are overlapped to form a first capacitance C1.

Therefore, according to the present embodiment, the common voltage of the common electrode line 230 of the first patterned conductive layer 235 is connected to the first patterned layer 260 of the second patterned conductive layer 245 through the first part 270 of the pixel electrode 275, the second contact window 300 and the first contact window 290. Thus, a capacitive coupling effect is produced between the first patterned layer 260 having the common voltage and a pixel voltage of the second part 280 in the pixel electrode 275 so as to form the first capacitance C1.

It should be noted that according to the embodiment shown by FIG. 2A, the two ends of the common electrode line 230 and the first patterned layer 260 in the pixel structure are both designed as having the first and the second contact windows 290 and 300 and the first part 270 of the pixel electrode 275. However, the present invention is not limited to this arrangement, and may have only one end of the common electrode line 230 designed as having the contact window structure and the first part of the pixel electrode. Further, the numbers of the first and the second contact windows 290 and 300 in the present embodiment are not intended to limit the present invention in this aspect; the numbers of the first and the second contact windows 290 and 300 may be one or a plurality.

Next, a description of a method of manufacturing the pixel structure is provided below.

Referring to FIGS. 2A and 2B first, a substrate 200 is provided. A first patterned conductive layer 245 is formed on the substrate 200. The first patterned conductive layer 245 includes a scan line 210, a common electrode line 230, and a gate 220 connected to the scan line 210. According to the present embodiment, the scan line 210, the gate 220 and the common electrode line 230 are formed simultaneously. The present embodiment is exemplified by the scan line 210 being electrically isolated from and disposed parallel to the common electrode line 230 but not limited thereto. According to other embodiments, the common electrode line 230 may further include a part perpendicular to the scan line 210 so that a top view of the common electrode line 230 substantially appears in a/an U, S, O, Z, W, V, 8, B, C, D, F, H, L or P shape or other suitable shapes. Said design not only increases the capacity but also reduces light leakage. Preferably, the top view of the common electrode line 230 substantially appears in a/an U, S, O, 8, B, C, D, F, H, L or P shape. Additionally, the present embodiment is exemplified by a scan line 210, a common electrode line 230 and a gate 220 but not limited thereto. In other embodiments, at least one of the scan line 210, the common electrode line 230, and the gate 220 may be designed as at least one to fulfill design requirements.

Afterwards, a second patterned conductive layer 245 is formed on the first patterned conductive layer 235. The second patterned conductive layer 245 includes a data line 240 intersected with the scan line 210, a first patterned layer 260 partly disposed on the common electrode line 230, and a source/drain 250 connected to the data line 240. It is noted that the first patterned layer 260 is electrically isolated from the data line 240, and the gate 220 and the source/drain 250 compose a TFT. Moreover, the present embodiment is exemplified by a data line 240, a source/drain 250 and a first patterned layer 260 but not limited thereto. In other embodiments, at least one of the data line 240, the source/drain 250, and the first patterned layer 260 may be designed as at least one according to the design requirements. For example, the common electrode line 230 as shown by FIG. 2A is exemplified by disposing a first patterned layer 260 at each of the left and right ends of the common electrode line 230, but not limited thereto. One or a plurality of first patterned layers 260 may also be disposed near one end of the common electrode line 230 or on other positions. Alternatively, on each of the plurality of positions in FIG. 2A, one or a plurality of first patterned layers 260 is disposed.

Finally, a pixel electrode 275 is disposed on the second patterned conductive layer 245. The pixel electrode 275 has a first part 270 and a second part 280 electrically isolated from the first part 270. The first part 270 covers a part of the first patterned layer 260 and a part of the common electrode line 230. The first part 270 is connected to the first patterned layer 260 through a first contact window 290 and connected to the common electrode line 230 through a second contact window 300. The second part 280 covers the other part of the first patterned layer 260 and is connected to the source/drain 250. A common voltage of the common electrode line 230 is thereby transmitted to the first patterned layer 260, and a capacitive coupling effect is produced between the first patterned layer 260 having the common voltage and the second part 280 of the pixel electrode 275 to form the first capacitance C1. It should be noted that according to the embodiment shown by FIG. 2A, the two ends of the common electrode line 230 and the first patterned layer 260 in the pixel structure are both designed as having the first and the second contact windows 290 and 300 and the first part 270 of the pixel electrode 275. However, the present invention is not limited to this arrangement, and may have only one end of the common electrode line 230 designed as having the contact window structure and the first part of the pixel electrode. Further, the numbers of the first and the second contact windows 290 and 300 in the present embodiment are not intended to limit the present invention in this aspect; the numbers of the first and the second contact windows 290 and 300 may be one or a plurality.

The Second Embodiment

Figure 3A:
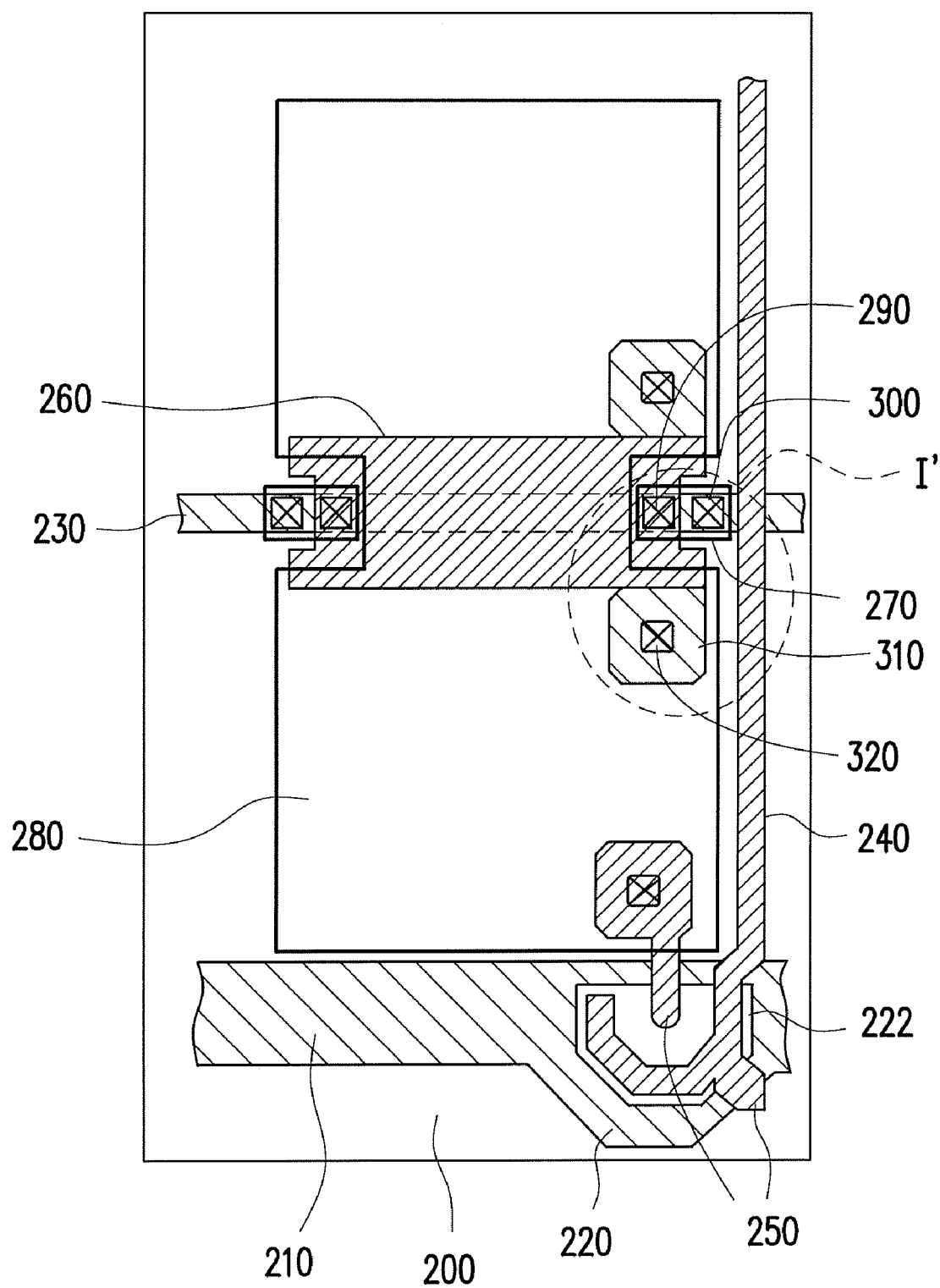
FIG. 3A is a top view of a pixel structure according to another embodiment of the present invention.
Figure 3B:
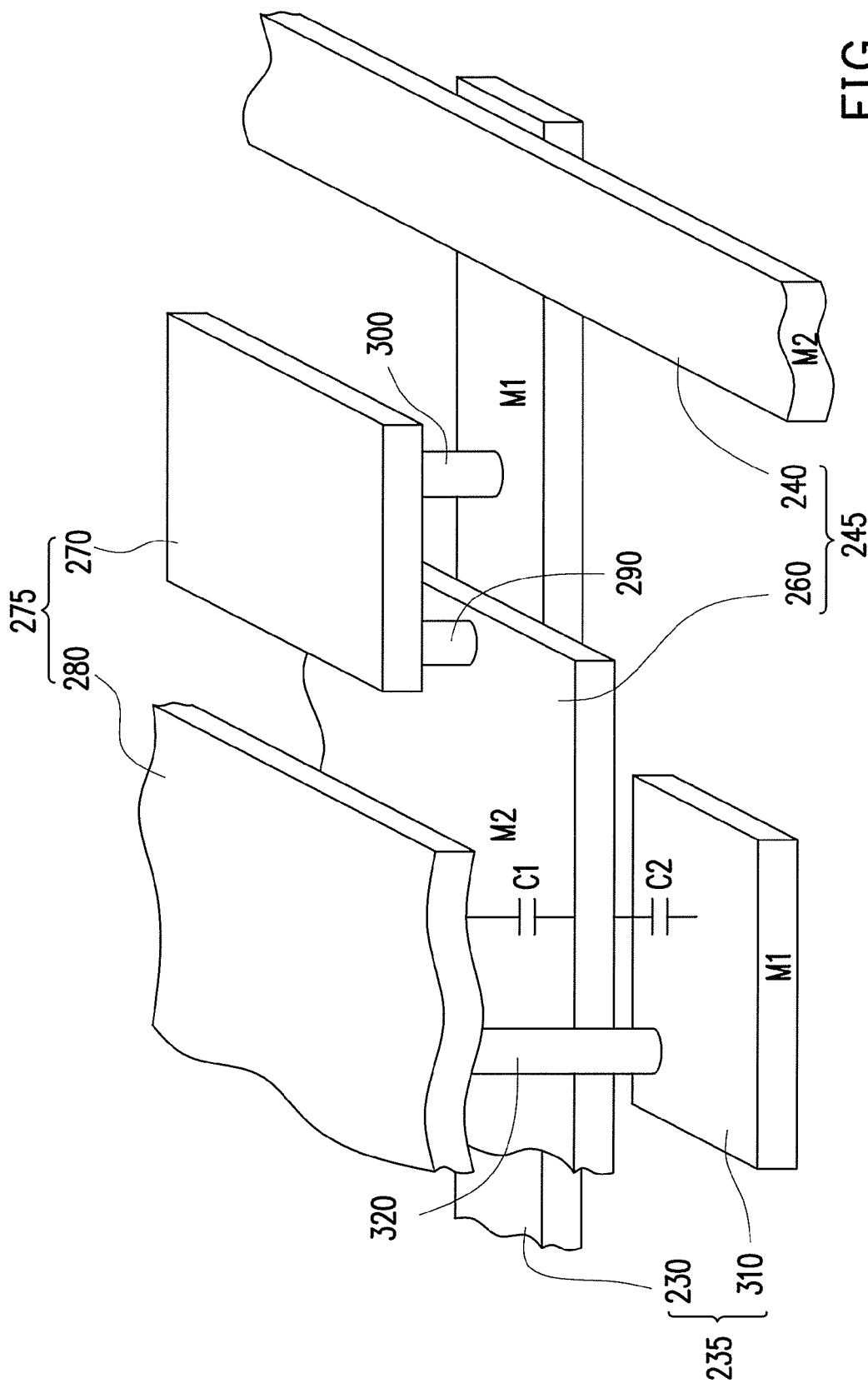
FIG. 3B is a schematic three-dimensional structure diagram of an area (corresponding to an area I' in FIG. 3A) where the storage capacitor is located in the pixel structure of FIG. 3A.

FIG. 3A is a top view of a pixel structure according to another embodiment of the present invention. FIG. 3B is a schematic three-dimensional structure diagram of an area (corresponding to an area I' in FIG. 3A) where a storage capacitor is located in the pixel structure of FIG. 3A. The reference numerals in FIGS. 3A and 3B are approximately the same as those in the first embodiment as shown by FIGS. 2A and 2B, and therefore the repeated reference numerals will not be described in detail again. Referring to both FIGS. 3A and 3B, the pixel structure includes a first patterned conductive layer 235, a second patterned conductive layer 245 and a pixel electrode 275 on a substrate 200.

The first patterned conductive layer 235 includes a scan line 210, a gate 220, a common electrode line 230, and a second patterned layer 310. The scan line 210 is connected to the gate 220. More specifically, the present embodiment is exemplified by the scan line 210 being electrically isolated from and disposed parallel to the common electrode line 230. However, such arrangement is only exemplary and is not intended to limit the present invention. According to other embodiments, the common electrode line 230 may further include a part perpendicular to the scan line 210 so that a top view of the common electrode line 230 substantially appears in a/an U, S, O, Z, W, V, 8, B, C, D, F, H, L or P shape or other suitable shapes. Said design not only increases the capacity but also reduces light leakage. Preferably, the top view of the common electrode line 230 substantially appears in a/an U, S, O, 8, B, C, D, F, H, L or P shape. Additionally, the present embodiment is exemplified by a scan line 210, a common electrode line 230 and a gate 220 but not limited thereto. According to other embodiments, at least one of the scan line 210, the common electrode line 230 and the gate 220 may be designed as at least one to fulfill design requirements. The second patterned layer 310 is electrically isolated from the common electrode line 230 and the scan line 210. The present embodiment is exemplified by two second patterned layers 310 but not limited thereto. According to other embodiments, there may be one or a plurality of second patterned layers 310. Moreover, the second patterned layer 310 in the present embodiment is designed as being disposed at only one end of the common electrode line 230 and on a side of a TFT correspondingly. However, the present embodiment should not be limited thereto. According to other embodiments, the second patterned layer 310 may be disposed not corresponding to the side of the TFT or disposed on a plurality of sides, and the number or the direction of the second patterned layer 310 are not defined.

The second patterned conductive layer 245 is disposed on the first patterned conductive layer 235 and includes a data line 240, a source/drain 250, and a first patterned layer 260. The data line 240 and the scan line 210 are intersected; the first patterned layer 260 is electrically isolated from the data line 240, and the data line 240 is connected to the source/drain 250. More particularly, the second patterned layer 310 is partly disposed under the first patterned layer 260.

The pixel electrode 275 is disposed on the second patterned conductive layer 245 and includes a first part 270 and a second part 280. The first part 270 is electrically isolated from the second part 280. The first part 270 covers a part of the first patterned layer 260 and a part of the common electrode line 230. Further, the first part 270 is connected to the first patterned layer 260 through a first contact window 290 and connected to the common electrode line 230 through a second contact window 300. The second part 280 covers the other part of the first patterned layer 260 and is connected to the source/drain 250. Further, the second part 280 is connected to the second patterned layer 310 through a third contact window 320. In other words, the first part 270 of the pixel electrode 275 is mainly used for connecting the common electrode line 230 with the first patterned layer 260 so that a common voltage of the common electrode line 230 is transmitted to the first patterned layer 260. The second part 280 of the pixel electrode 275 not only connects with the second patterned layer 310 so as to transmit a pixel voltage of the pixel electrode 275 to the second patterned layer 310, but also serves as a primary pixel electrode of the pixel structure. According to the embodiment as shown by FIG. 3A, the two ends of the common electrode line 230 and the first patterned layer 260 in the pixel structure are both designed as having the first and the second contact windows 290 and 300 and the first part 270 of the pixel electrode. However, the present invention is not limited to this arrangement, and may have only one end of the common electrode line 230 designed as having the contact window structure and the first part of the pixel electrode. Furthermore, the second patterned layer 310 and the third contact window 320, as shown by FIG. 3A, are designed as disposed only at one end of the common electrode line 230, but the present invention is not limited thereto. According to other embodiments, the second patterned layer 310 and the third contact window 320 may be disposed at the two ends of the common electrode line 230 (and the first patterned layer 260) or on other positions in the pixel structure. Besides, the numbers of the first, the second and the third contact windows 290, 300 and 320 in the present embodiment are not intended to limit the present invention in this aspect; the numbers of the first, the second and the third contact windows 290, 300 and 320 may be one or a plurality.

Similarly, an insulating layer is further disposed between the first patterned conductive layer 235 and the second patterned conductive layer 245. A passivation layer is further disposed between the second patterned conductive layer 245 and the pixel electrode 275. As to the material, design, number and position of the first patterned conductive layer 235, the second patterned conductive layer 245, the pixel electrode 275, the insulating layer, and the passivation layer are the same as or similar to those described in the first embodiment, and thus they are not repeated herein. Further, the structure of the TFT in the pixel structure in this embodiment is also the same as or similar to that in the first embodiment, and therefore is not repeated herein.

Particularly, referring to FIGS. 3A and 3B, the present embodiment differs from the first embodiment in that according to the present embodiment the first patterned layer 260 of the second patterned conductive layer 245 and the second part 280 of the pixel electrode 275 are overlapped to form a first capacitance C1, and that the first patterned layer 260 of the second patterned conductive layer 245 and the second patterned layer 310 of the first patterned conductive layer 235 are further overlapped to form a second capacitance C2.

In even more detail, according to the present embodiment, the common voltage of the common electrode line 230 of the first patterned conductive layer 235 is transmitted to the first patterned layer 260 of the second patterned conductive layer 245 through the first part 270 of the pixel electrode 275, the second contact window 300 and the first contact window 290. Thus, a capacitive coupling effect is produced between the first patterned layer 260 having the common voltage and the second part 280 of the pixel electrode 275 so as to form the first capacitance C1. Furthermore, the pixel voltage of the second part 280 is connected to the second patterned layer 310 of the first patterned conductive layer 235 through the pixel voltage of the second part 280 of the pixel electrode 275 and the third contact window 320. Thus, a capacitive coupling effect is produced between the first patterned layer 260 having the common voltage and the second patterned layer 310 having the pixel level so as to form the second capacitance C2.

It should be noted that according to the embodiment shown by FIG. 3A, the two ends of the common electrode line 230 and the first patterned layer 260 in the pixel structure are both designed as having the first and the second contact windows 290 and 300 and the first part 270 of the pixel electrode 275. However, the present invention is not limited to this arrangement and may have only one end of the common electrode line 230 designed as having the contact window structure and the first part of the pixel electrode. Additionally, according to the embodiment shown by FIG. 3A, only one end of the common electrode line 230 and the first patterned layer 260 in the pixel structure is designed as having the second patterned layer 310. Nevertheless, the present invention is not limited to such arrangement. In the present invention, the second patterned layer 310 may also be designed as disposed at the two ends of the common electrode line 230 or on other positions in the pixel structure.

Next, a description of a method of manufacturing the pixel structure is provided below.

Referring to FIGS. 3A and 3B first, a substrate 200 is provided. A first patterned conductive layer 235 is formed on the substrate 200. The first patterned conductive layer 235 includes a scan line 210, a common electrode line 230, a second patterned layer 310, and a gate 220 connected to the scan line 210. According to the present embodiment, the scan line 210, the gate 220, the common electrode line 230 and second patterned layer 310 are formed simultaneously. The present embodiment is exemplified by the scan line 210 being electrically isolated from the common electrode line 230, but not limited to thereto. According to other embodiments, the common electrode line 230 may include a part perpendicular to the scan line 210 so that a top view of the common electrode line 230 substantially appears in a/an U, S, O, Z, W, V, 8, B, C, D, F, H, L or P shape or other suitable shapes. Said design not only increases the capacity but also reduces light leakage. Preferably, the top view of the common electrode line 230 substantially appears in a/an U, S, O, 8, B, C, D, F, H, L or P shape. In addition, the present embodiment is exemplified by a scan line 210, a common electrode line 230 and a gate 220, but not limited thereto. According to other embodiments, at least one of the scan line 210, the common electrode line 230 and the gate 220 may be designed as at least one to fulfill design requirements. The second patterned layer 310 is electrically isolated from the common electrode line 230 and the scan line 210. The present embodiment is exemplified by two second patterned layers 310 but not limited thereto. According to other embodiments, there may be one or a plurality of second patterned layers 310. Moreover, the present embodiment is exemplified by the second patterned layer 310 being disposed at one end of the common electrode line 230 and on a side corresponding to a side of a TFT, but not limited thereto. According to other embodiments, the second patterned layer 310 may be disposed not corresponding to the side of the TFT or disposed on a plurality of sides, and the number or the direction of the second patterned layer(s) 310 are not limited.

Afterwards, a second patterned conductive layer 245 is formed on the first patterned conductive layer 235. The second patterned conductive layer 245 includes a data line 240 intersected with the scan line 210, a first patterned layer 260 partly disposed on the common electrode line 230, and a source/drain 250 connected to the data line 240. It is noted that the first patterned layer 260 is electrically isolated from the data line 240, and the gate 220 and the source/drain 250 compose a TFT. Furthermore, the second patterned layer 310 is partly disposed under the first patterned layer 260.

Finally, a pixel electrode 275 is formed on the second patterned conductive layer 245, and the pixel electrode 275 has a first part 270 and a second part 280 electrically isolated from the first part 270.

The first part 270 covers a part of the first patterned layer 260 and a part of the common electrode line 230. Further, the first part 270 is connected to the first patterned layer 260 through a first contact window 290 and connected to the common electrode line 230 through a second contact window 300. The second part 280 covers the other part of the first patterned layer 260. Further, the second part 280 is connected to the source/drain 250 and connected to the second patterned layer 310 through a third contact window 320. According to the embodiment as shown by FIG. 3A, the two ends of the common electrode line 230 and the first patterned layer 260 in the pixel structure are both designed as having the first and the second contact windows 290 and 300 and the first part 270 of the pixel electrode 275. However, the present invention is not limited to this arrangement and may also have only one end of the common electrode line 230 designed as having the contact window structure and the first part of the pixel electrode. Furthermore, the second patterned layer 310 and the third contact window 320, as shown by FIG. 3A, are designed as being disposed at only one end of the common electrode line 230, but the present invention is not limited thereto. According to other embodiments, the second patterned layer 310 and the third contact window 320 are disposed at the two ends of the common electrode line 230 and the first patterned layer 260 or on other positions in the pixel structure. Besides, the numbers of the first, the second and the third contact windows 290, 300 and 320 are not intended to limit the present invention in this aspect; the numbers of the first, the second and the third contact windows 290, 300 and 320 may be one or a plurality.

Figure 4:
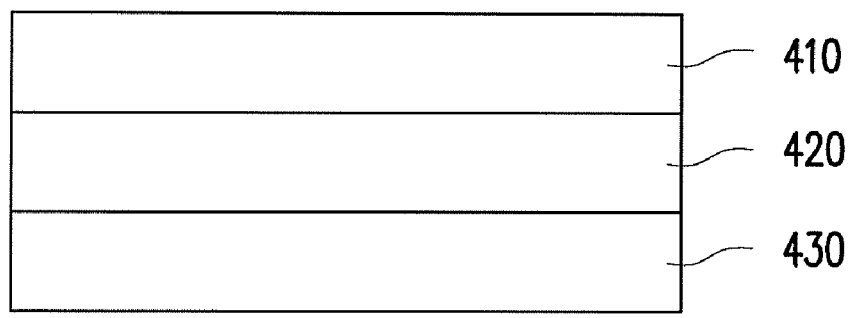
FIG. 4 is a schematic view of a display panel according to an embodiment of the present invention.

FIG. 4 is a schematic view of a display panel according to an embodiment of the present invention. Referring to FIG. 4, a finished product of a display panel 400 in the present embodiment includes at least one pixel array substrate 430, another substrate 410 opposite to the pixel array substrate 430, and a display medium 420 disposed between the pixel array substrate 430 and the substrate 410. The pixel array substrate 430 has the pixel structure as shown by FIG. 2A or the pixel structure as shown by FIG. 3A. A method of manufacturing the display panel 400 includes the method of manufacturing the pixel structure of FIG. 2A or the method of manufacturing the pixel structure of FIG. 3A. Additionally, an inner surface of the substrate 410 is covered with a covering layer (not shown). The covering layer includes at least one of a color filter, a transparent conductive layer, and an alignment layer. Taking a general display panel for example, a covering layer thereof includes a color filter, a transparent conductive layer, and an alignment layer. Taking a special display panel for example, a covering layer thereof may only include a color filter, an alignment layer, a transparent conductive layer, a color filter and a transparent conductive layer, or a color filter and an alignment layer.

Furthermore, the display panel 400 may be a transflective display panel, reflective display panel, color filter on array display panel (COA display panel), array on color filter display panel (AOC display panel), vertical alignment display panel (VA display panel), in-plane switching display panel (IPS display panel), multi-domain vertically alignment display panel (MVA display panel), twisted nematic display panel (TN display panel), super twisted nematic (STN display panel), patterned vertical alignment display panel (PVA display panel), super patterned vertical alignment display panel (S-PVA display panel), advanced super view display panel (ASV display panel), fringe field switching display panel (FFS display panel), continuous pinwheel alignment display panel (CPA display panel), axially symmetric aligned microcell display panel (ASM display panel), optically compensated bend display panel (OCB display panel), super in-plane switching display panel (S-IPS display panel), advanced super in-plane switching display panel (AS-IPS display panel), ultra fringe field switching display panel (UFFS display panel), anisotropic polymer-dispersed display panel, dual-view display panel, triple-view display panel, three-dimensional display panel (3-D display panel), multi-panel of display or other suitable display panels (such as self-emissive light display panels).

Figure 5:
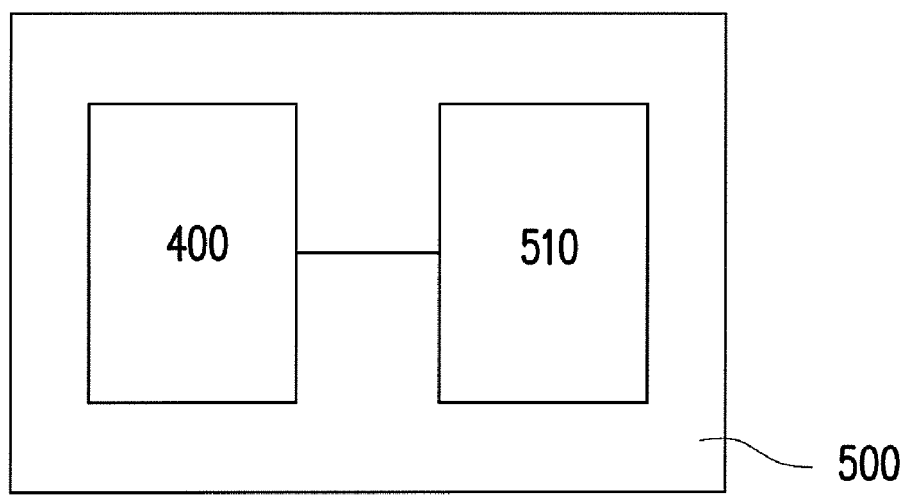
FIG. 5 is a schematic view of a photoelectric device according to an embodiment of the present invention.

FIG. 5 is a schematic view of a photoelectric device according to an embodiment of the present invention. Referring to FIG. 5, the display panel 400 of the above embodiment may be electrically connected to an electronic element 510 to be assembled as a photoelectric device 500. A method of manufacturing the photoelectric device 500 includes a method of manufacturing the display panel 400, and each step in a process of the photoelectric device 500 is carried out to assemble a display apparatus so as to obtain the photoelectric device 500. According to the present embodiment, the pixel structure as shown by FIG. 2A or the pixel structure as shown by FIG. 3A is used as the pixel structure of the pixel array substrate 430 (referring to FIG. 4) in the display panel 400.

Further, the electronic element 510 includes a control device, an operating device, a processing device, an input device, a memory device, a driving device, a light-emitting device, a protection device, a sensing device, a detecting device, other devices having other functions, or a combination thereof. The photoelectric device 500 includes portable products (e.g. mobile phones, camcorders, cameras, laptop computers, game players, watches, music players, e-mail receivers and senders, map navigators, digital photos, or the like), audio-video products (e.g. audio-video players or the like), screens, televisions, bulletins, panels in projectors, and so on.

In summary, the common electrode line in the storage capacitor of the pixel structure in the present invention is electrically connected to the at least one first patterned layer of the second patterned conductive layer through the at least one second contact window, the at least one first part of the pixel electrode and the at least one first contact window. Consequently, the at least one first patterned layer of the second patterned conductive layer and the at least one second part of the pixel electrode are capacitively coupled to form at least one first capacitance. According to another embodiment of the present invention, the at least one second patterned layer of the first patterned conductive layer and the at least one first patterned layer of the second patterned conductive layer are overlapped to further compose at least one second capacitance. Accordingly, under the precondition that an equivalent storage capacitance value is achieved, the area occupied by the storage capacitor is reduced and the aperture ratio of the pixel structure is increased so that the overall design of the panel has more space.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a pixel structure, comprising:

providing a substrate;

forming at least one first patterned conductive layer on the substrate, the first patterned conductive layer comprising at least one scan line, at least one gate connected to the scan line, and at least one common electrode line, wherein the scan line is electrically isolated from the common electrode line;

forming a second patterned conductive layer on the first patterned conductive layer, the second patterned conductive layer comprising at least one data line intersected with the scan line, at least one source/drain connected to the data line, and at least one first patterned layer partly disposed on the common electrode line, wherein the first patterned layer is electrically isolated from the data line, and the gate, the source and the drain compose at least one TFT; and forming at least one pixel electrode on the second patterned conductive layer, the pixel electrode comprising at least one first part and at least one second part electrically isolated from the first part, the first part covering a part of the first patterned layer and a part of the common electrode line, the first part being connected to the first patterned layer through at least one first contact window, the first part being connected to the common electrode line through at least one second contact window, the second part covering the other part of the first patterned layer, the second part being connected to the source/drain, the first patterned layer and the second part composing at least one first capacitance.

2. The method of manufacturing the pixel structure of claim 1, when forming the first patterned conductive layer on the substrate, further comprising forming at least one second patterned layer on the substrate, the second patterned layer partly disposed under the first patterned layer and electrically connected to the second part of the pixel electrode through at least one third contact window, wherein the second patterned layer is electrically isolated from the common electrode line and the scan line, and the first patterned layer and the second patterned layer compose at least one second capacitance.

3. A method of manufacturing a display panel, comprising the method of manufacturing the pixel structure of claim 1.

4. A method of manufacturing a photoelectric device, comprising the method of manufacturing the display panel of claim 3.

5. A pixel structure, comprising:
a substrate;
a first patterned conductive layer, disposed on the substrate and comprising at least one scan line, at least one gate connected to the scan line, and at least one common electrode line, wherein the scan line is electrically isolated from the common electrode line;

a second patterned conductive layer, disposed on the first patterned conductive layer and comprising at least one data line intersected with the scan line, at least one source/drain connected to the data line, and at least one first patterned layer partly disposed on the common electrode line, wherein the first patterned layer is electrically isolated from the data line, and the gate, the source and the drain compose at least one thin film transistor (TFT); and a pixel electrode, disposed on the second patterned conductive layer and comprising at least one first part and at least one second part electrically isolated from the first part, the first part covering a part of the first patterned layer and a part of the common electrode line, the first part being connected to the first patterned layer through at least one first contact window, the first part being connected to the common electrode line through at least one second contact window, the second part covering the other part of the first patterned layer, the second part being connected to the source/drain, the first patterned layer and the second part composing at least one first capacitance.

6. The pixel structure of claim 5, wherein the first patterned conductive layer further comprises at least one second patterned layer disposed on the substrate, the second patterned layer partly disposed under the first patterned layer and electrically connected to the second part of the pixel electrode through at least one third contact window, wherein the second patterned layer is electrically isolated from the common electrode line and the scan line, and the first patterned layer and the second patterned layer compose at least one second capacitance.

7. A display panel, comprising the pixel structure of claim 5.

8. A photoelectric device, comprising the display panel of claim 7.

* * * * *